United States Patent

Iwamoto et al.

[11] Patent Number: 5,258,207
[45] Date of Patent: Nov. 2, 1993

[54] AMORPHOUS SILICON FILM, ITS PRODUCTION AND PHOTO SEMICONDUCTOR DEVICE UTILIZING SUCH A FILM

[75] Inventors: Masayuki Iwamoto, Itami; Koji Minami, Higashiosaka; Toshihiko Yamaoki, Osaka, all of Japan

[73] Assignee: Sanyo Electric Co., Ltd., Moriguchi, Japan

[21] Appl. No.: 917,315

[22] Filed: Jul. 23, 1992

Related U.S. Application Data

[62] Division of Ser. No. 574,019, Aug. 29, 1990, Pat. No. 5,152,833.

[30] Foreign Application Priority Data

| Aug. 31, 1989 | [JP] | Japan | 1-226000 |
| Dec. 7, 1989 | [JP] | Japan | 1-318070 |
| Mar. 27, 1990 | [JP] | Japan | 2-77942 |

[51] Int. Cl.$^5$ .............................................. B05D 3/06
[52] U.S. Cl. ........................................ 427/578; 427/563
[58] Field of Search ........................ 427/563, 578, 569

[56] References Cited

U.S. PATENT DOCUMENTS

| 4,409,311 | 10/1983 | Kawamura et al. | 430/95 |
| 4,664,937 | 5/1987 | Ovshinsky et al. | 427/578 |
| 4,668,599 | 5/1987 | Yamazaki et al. | 427/578 |
| 4,746,535 | 5/1988 | Fukaya et al. | 427/578 |
| 4,759,947 | 7/1988 | Ishihara et al. | 427/563 |
| 4,766,007 | 8/1988 | Kurokawa | 427/578 |
| 4,784,874 | 11/1988 | Ishihara et al. | 427/563 |
| 4,883,686 | 11/1989 | Doehler et al. | 427/563 |
| 5,098,736 | 5/1992 | Fakuda | 427/578 |

*Primary Examiner*—Marianne Padgett
*Attorney, Agent, or Firm*—Armstrong, Westerman, Hattori, McLeland & Naughton

[57] ABSTRACT

An amorphous silicon film contains not less than 30 at. % hydrogen and includes silicon atoms joined with one hydrogen atom and silicon atoms joined with two hydrogen atoms, the ratio of the silicon atoms joined with two hydrogen atoms to the silicon atoms joined with one hydrogen atom being not more than 0.4. This amorphous silicon films is produced by performing plasma-assisted chemical vapor deposition at a substrate temperature of not more than 100° C., while supplying hydrogen and silane in the predetermined ratio, the ratio of the flow of hydrogen to that of silane being not less than 1.

3 Claims, 6 Drawing Sheets

A: JUST AFTER PRODUCTION

B: AFTER LEAVING AT ROOM TEMPERATURE

C: AFTER ANNEALING AT 80 °C

D: AFTER ANNEALING AT 160 °C

AMORPHOUS SILICON FILM, ITS PRODUCTION AND PHOTO SEMICONDUCTOR DEVICE UTILIZING SUCH A FILM

This is a division of application Ser. No. 574,019 filed Aug. 29, 1990, now U.S. Pat. No. 5,152,833.

BACKGROUND OF THE INVENTION

1. Field of the invention

The present invention relates to an amorphous silicon film and its production. More particularly, the present invention relates to an amorphous silicon film with wide optical bandgap and high photoelectric conductivity and a method for production of such a film. Also, the present invention relates to a photo-semiconductor device utilizing such an amorphous silicon film.

2. Description of the Prior art

In general, amorphous silicon films for use in photo semiconductor devices such as, for example, photovoltaic devices are required to have a wide bandgap to use incident light effectively.

To this end, so far, it has been proposed to incorporate additives such as carbon or oxygen into amorphous silicon films. However, incorporation of such an additive causes decrease in characteristics of the film, especially, photo electric conductivity, as disclosed in Journal of Non-Crystalline Solids 97&98 (1987) 1027-1034.

On the other hand, amorphous silicon films with a wide bandgap can be produced by increasing the hydrogen concentration in the amorphous silicon film, without incorporation of additives such as carbon. It is possible to produce amorphous silicon films containing 30 atomic % of hydrogen if the substrate is maintained at a temperature of 100° C. or less during formation of the film. However, the amorphous silicon films produced at a substrate temperature of 100° C. or less were considerably low in photo electric conductivity, thus making it impossible to produce photo conductive devices with excellent characteristics.

SUMMARY OF THE INVENTION

It is therefore an object of the present invention to provide amorphous silicon films having a wide bandgap and excellent film characteristics, especially, high photo electric conductivity.

Another object of the present invention is to provide a method for producing amorphous silicon films having a wide bandgap and high photo electric conductivity.

Still another object of the present invention is to provide a photo semiconductor devices such as photovoltaic devices comprising an amorphous silicon film with a wide bandgap and high photo electric conductivity.

According to the present invention, these and other objects are solved by providing an amorphous silicon film containing not less than 30 at. % hydrogen and including silicon atoms joined with one hydrogen atom and silicon atoms joined with two hydrogen atoms, the ratio of said silicon atoms joined with two hydrogen atoms to silicon atoms joined with one hydrogen atom being not more than 0.4.

According to the present invention, the above amorphous silicon film may be produced by a method in which plasma-assisted chemical vapor deposition (PACVD) is carried out at a substrate temperature of not more than 100° C., while supplying hydrogen ($H_2$) gas and silane ($SiH_4$) gas in a suitable flow ratio into the reaction system, the flow ratio of hydrogen gas to silane gas being not less than 1.

The PACVD process includes the steps of positioning a substrate between a pair of electrodes in a reaction vessel, evacuating the reaction vessel to a vacuum of $10^{-5}$ Torr or above, introducing hydrogen and silane in the predetermined ratio into the reaction vessel to adjust a pressure in the vessel to 0.2 Torr or less, and supplying a radio frequency power between the electrodes, while supplying hydrogen and silane in the above ratio to the vessel. During the plasma-assisted chemical vapor deposition, the pressure in the vessel is kept constant by evacuation.

In a preferred embodiment, the above amorphous silicon film is produced by the PACVD process in which a radio frequency (RF) power of not more than 17 mw/cm$^2$ is applied to the electrodes at a substrate temperature of not more than 100° C.

In another preferred embodiment, the amorphous silicon film is produced by the PACVD process at a substrate temperature of not more than 100° C. and at a reaction pressure of not more than 0.1 Torr.

The amorphous silicon film according to the present invention has a wide bandgap because of its high concentration of hydrogen atoms of not less than 30 at. %. In addition, the film of the present invention possesses high photo-conductivity as it contains silicon atoms joined with one hydrogen atom (hereinafter referred to as a SiH bond) and silicon atoms joined with two hydrogen atoms (hereinafter referred to as $SiH_2$ bond) in the $SiH_2$ bond/SiH bond ratio of not more than 0.4.

According to the present invention, there is also provided a photo-semiconductor device comprising an amorphous silicon film containing not less than 30 at. % hydrogen atoms and including silicon atoms joined with one hydrogen atom and silicon atoms joined with two hydrogen atoms in the ratio of the $SiH_2$ bond to the SiH bond being not more than 0.4.

The invention will be further apparent from the following description with reference to several examples and the accompanying drawings.

DETAILED DESCRIPTION OF THE INVENTION

Example 1

Using the known parallel-plate reactor for PACVD, amorphous silicon films were produced by plasma-assisted chemical vapor deposition from silane ($SiH_4$) and hydrogen ($H_2$). The PACVD was carried out in the following manner: After positioning a substrate between a pair of electrodes, a reaction vessel is evacuated to a vacuum of more than $1 \times 10^{-6}$ Torr, and then supplied with hydrogen and silane in the predetermined ratio to adjust the pressure in the vessel to 0.2 Torr. At the same time, the substrate is heated to a temperature of not more than 100° C. While supplying hydrogen and silane in the above ratio and keeping the pressure in the vessel constant, a radio frequency power is applied between the electrodes to carry out plasma-assisted chemical vapor deposition under the following conditions.

Substrate temperature: 80° C.
RF power (13.56 MHz): 25 W (25 mw/$cm^2$)
Pressure: 0.2 Torr
Flow of $SiH_4$: 40 sccm
Flow of $H_2$: 0–200 sccm The quantity of the SiH bond and that of the $SiH_2$ bond in the deposited film was determined by measurement of peak values of infrared spectrum or laman spectrum at 2000 $cm^{-1}$ and 2090 $cm^{-1}$. The ratio of the $SiH_2$ bond to the SiH bond, i.e., the $SiH_2$ bond/SiH bond ratio, are plotted in FIG. 1 as a function of the ratio of the flow of $H_2$ to that of $SiH_4$ during deposition.

Figure 2:
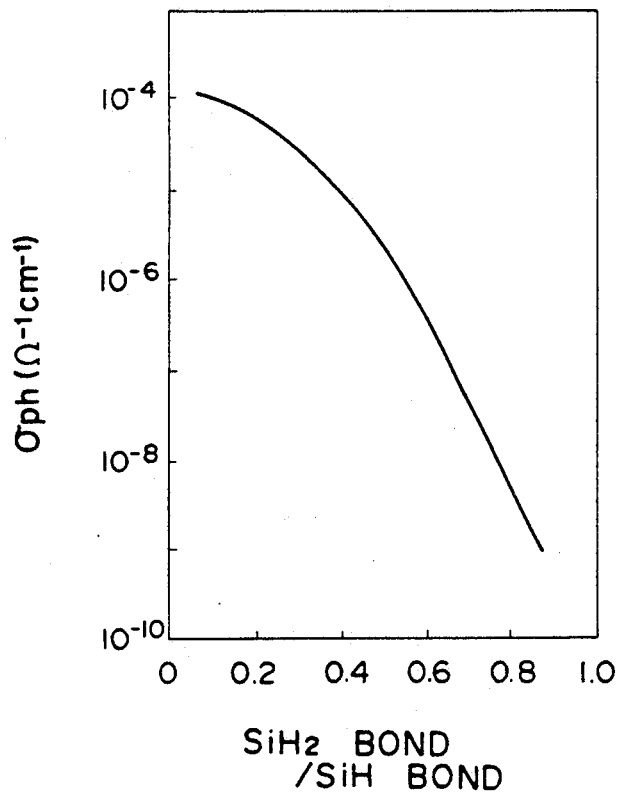
FIG. 2 is a graph showing variation of photo electric conductivity with the ratio of the number of silicon atoms joined with two hydrogen atoms to that of silicon atoms joined with one hydrogen atom in the amorphous silicon film.

The above amorphous silicon film was provided with a spaced pair of electrodes with size of 2 cm×2 cm to determine the photo electric conductivity. The photo electric conductivity ($\sigma$ph) of each amorphous silicon film was determined by measurement of a current flowing under exposure to light with a strength 100 mw/$cm^2$. The results are plotted in FIG. 2 as a function of the $SiH_2$ bond/SiH bond ratio.

Figure 1:
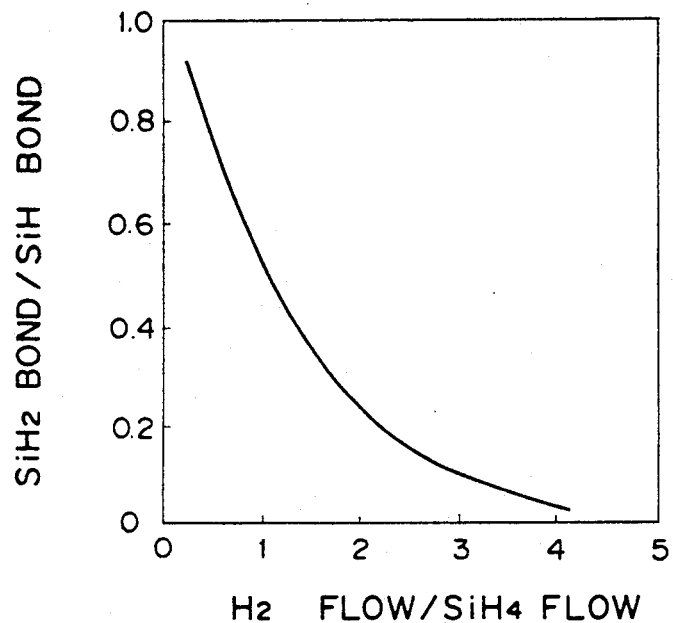
FIG. 1 is a graph showing variation of the ratio of silicon atoms joined with one hydrogen atom to silicon atoms joined with two hydrogen atoms in the amorphous silicon film with the flow ratio of hydrogen ($H_2$) to silane ($SiH_4$) during fabrication of the film.

As will be understood from the results shown in FIG. 1, the $SiH_2$ bond/SiH bond ratio in the deposited film can be controlled within the range from about 0.1 to 1 by adjusting the ratio of the flow of $H_2$ to that of $SiH_4$. Further, as can be seen from the results shown in FIG. 2, the photoelectric conductivity ($\sigma$ph) varies with the $SiH_2$ bond/SiH bond ratio and exceeds $10^{-5}/\Omega$cm if the $SiH_2$ bond/SiH bond ratio in the deposited film is not greater than 0.4.

For these reasons, the composition of the amorphous silicon film of the present invention has been limited to those containing not less than 30 at. % of hydrogen and including silicon atoms joined with two hydrogen atoms and silicon atoms joined with one hydrogen atom in the $SiH_2$ bond/SiH bond ratio of not more than 0.4.

Example 2

There were prepared amorphous silicon films in the same manner as Example 1 except for that the flow amount of hydrogen gas is adjusted to 40 sccm or 200 sccm to that the flow rate of $H_2$ to $SiH_4$ is 1:1, or 5:1.

Comparative Example 1

There were prepared amorphous silicon films in the same manner as Example 1 except for that no hydrogen gas was supplied to the reaction system.

The amorphous silicon films prepared in example 2 and comparative example 1 were subjected to measurement of the photo electric conductivity. The measurements were made just after production of the film, after leaving the film at room temperature for more than 1 month, and after annealing it at 80° C. or 160° C. for 2 hours. Results are plotted in FIG. 3.

Figure 3:
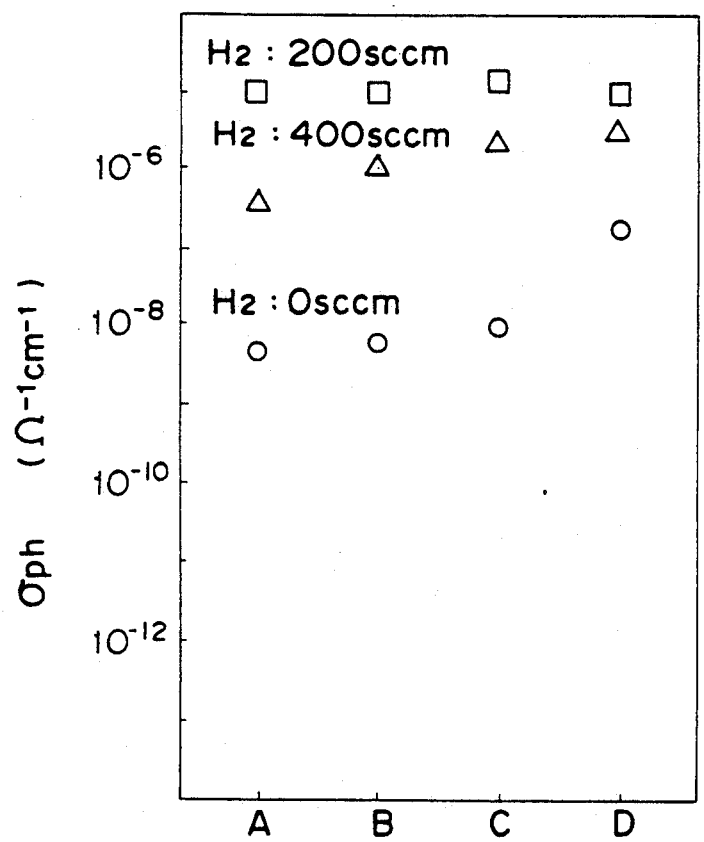
FIG. 3 is a graph showing variation of photo electric conductivity ($\sigma ph$)) with temperature for amorphous silicon films of the present invention and the prior art.

From the results shown in FIG. 3, it will be seen that the photoelectric conductivity of the amorphous silicon films of the present invention scarcely varies with the temperature. Thus, the amorphous silicon film of the present invention possesses high heat resistivity.

Example 3

There were prepared amorphous silicon films in the same manner as Example 1 except for that the RF power supplied was adjusted to a value in the range of 15 to 25 mw/$cm^2$. Other conditions for PACVD were as follows:

Substrate temperature: 80° C.
Flow of silane: 10 sccm or 40 sccm
Flow of hydrogen: 0 sccm The resultant amorphous silicon films were subjected to measurements of the photo electric conductivity ($\sigma$ph) and the $SiH_2$ bond/SiH bond ratio in the deposited film. Results are plotted in FIGS. 4 and 5 as a function of the RF power, respectively.

Figure 4:
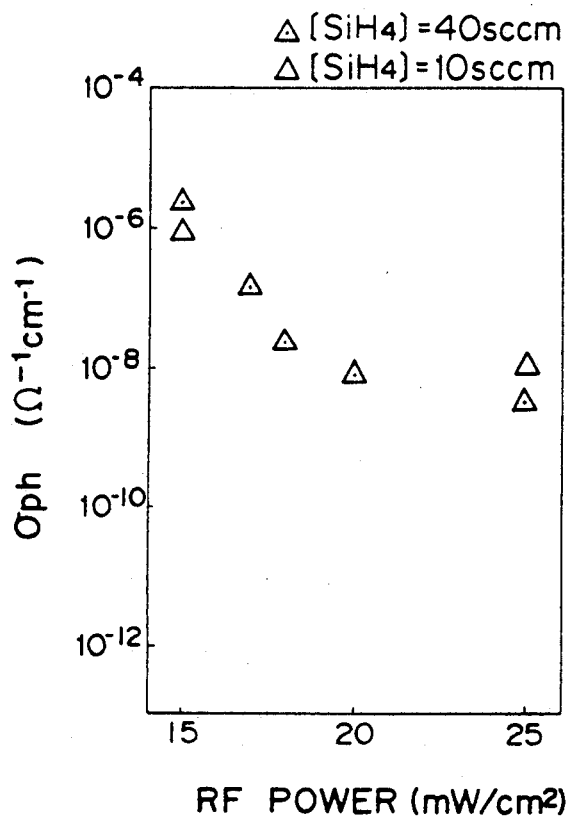
FIG. 4 is a graph showing the relationship between the photo electric conductivity and RF power.
Figure 5:
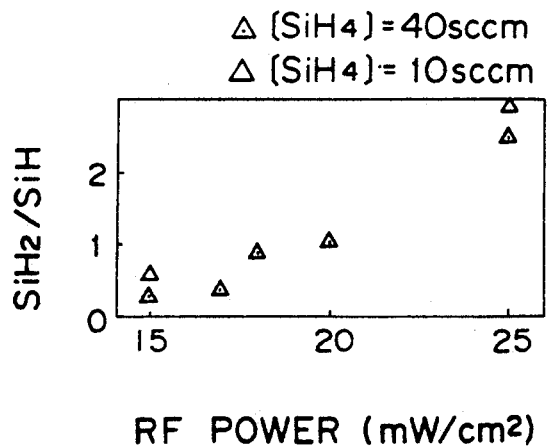
FIG. 5 is a graph showing the relationship between the ratio of the number of silicon atoms joined with two hydrogen atoms to that of silicon atoms joined with one hydrogen atom in the amorphous silicon film and RF power.

As can be seen from the results shown in FIGS. 4 and 5, when the RF power is not more than 17 mw/$cm^2$, the $SiH_2$ bond/SiH bond ratio in the deposited film becomes not more than 0.4, and the photo electric conductivity ($\sigma$ph) becomes not less than $10^{-7}/\Omega$cm, regardless of the flow of silane during deposition.

Example 4

There were prepared amorphous silicon films in the same manner as Example 1 except for that the pressure in the reaction system was adjusted to the predetermined value of not more than 0.2 Torr. The conditions other than the gas pressure are as follows:

Substrate temperature: 80° C.
RF power (13.56 MHz): 25 W (25 mw/$cm^2$)
Flow of $SiH_4$: 10 sccm or 40 sccm
Flow of $H_2$: 0 sccm For each resultant amorphous film, measurements were made on photo electric conductivity ($\sigma$ph) and the $SiH_2$ bond/SiH bond ratio in the deposited film. Results are plotted in FIGS. 6 and 7 as a function of pressure in the reaction system, respectively.

Figure 6:
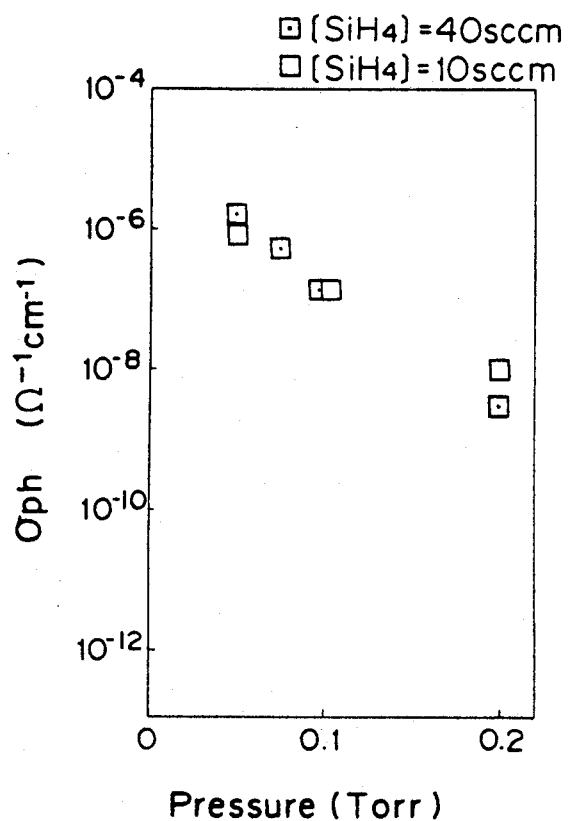
FIG. 6 is a graph showing the relationship between the photo electric conductivity and the gas pressure in the reaction system.
Figure 7:
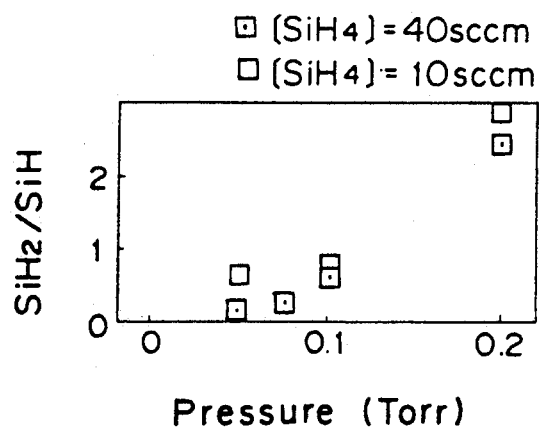
FIG. 7 is a graph showing the relationship between the gas pressure in the system and the ratio of the number of silicon atoms joined with two hydrogen atoms to that of silicon atoms joined with one hydrogen atom in the film produced.

As can be seen from the results shown in FIGS. 6 and 7, when the amorphous silicon film is produced under the reaction pressure of not more than 0.1 Torr, the $SiH_2$ bond/SiH bond ratio becomes not more than 0.4, and the photo electric conductivity ($\sigma$ph) becomes not less than $10^{-7}/\Omega$cm, regardless of the flow of silane during deposition.

Thus, it is possible to produce amorphous silicon films which have a high bandgap of 1.9 to 2.0 eV and high photo electric conductivity of $10^{-7}/\Omega$cm to $10^{-5}/\Omega$cm by carrying out the PACVD process on condition that the substrate temperature is not more than 100° C. and the reaction pressure is not more than 0.1 Torr.

Figure 8:
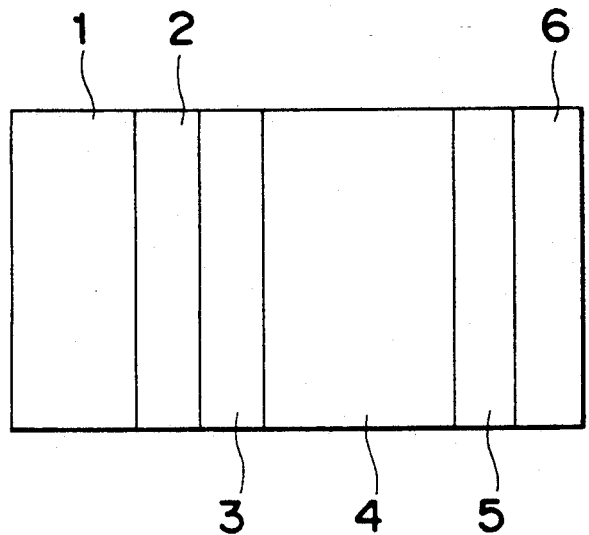

Referring now to FIG. 8, there is shown a photovoltaic device which is one embodiment of a photo semiconductor device utilizing an amorphous silicon film of the present invention. This device comprises a glass substrate 1, a transparent electrode layer 2 composed of a $SnO_2$ film with a thickness of 5000 Å, a p-type layer 3 composed of a B-doped amorphous silicon carbide film with a thickness of 100 Å, i-type layer 4 composed of an amorphous silicon film with a thickness of 5000 Å, n-type layer 5 composed of a P-doped amorphous silicon film with a thickness of 500 Å, and a metal electrode layer 6 composed of a conductive metal such as Ag. These layers are deposited in the order illustrated.

The amorphous silicon film used as the i-type layer 4 is formed, in accordance with the present invention, by the PACVD process under the following conditions:
  Substrate temperature: 80° C.
  RF power (13.56 MHz): 35 W (35 mw/cm$^2$)
  Reaction pressure: 0.2 Torr
  Flow of $SiH_4$: 10 sccm
  Flow of $H_2$: 20 sccm It was observed that the concentration of hydrogen in the produced amorphous silicon film is 35 at. %, and the $SiH_2$ bond/SiH bond ratio is 0.3. An open-circuit voltage of the photovoltaic device comprising such an amorphous silicon film was 0.95 V, whereas that of the photovoltaic device comprising the amorphous silicon film of the prior art was 0.85 V.

In the above embodiment, the B-doped amorphous silicon carbide film has been used as the p-type layer 3. This may be replaced with a B-doped amorphous silicon film produced under the following conditions:
  Substrate temperature: 80° C.
  RF power (13.56 MHz): 25 W
  Reaction pressure: 0.2 Torr
  Flow of $SiH_4$: 10 sccm
  Flow of $H_2$: 20 sccm
  Flow of $B(CH_3)_3$: 0.3 sccm If such an amorphous silicon film is used as the p-type layer 3, the photo absorption coefficient based on a wide bandgap of the film is reduced to one-half the value ($1 \times 10^4$ cm$^{-1}$ at 650 nm) of the photovoltaic device of the prior art. Thus, it is possible to reduce the absorption loss caused by the p-type layer 3. This is supported by the fact that the short circuit current of the photovoltaic device is increased from 17 mA/cm$^2$ to 18 mA/cm$^2$.

Also, the P-doped amorphous silicon film used as the n-type layer 5 may be replaced with a P-doped amorphous silicon film produced under the following conditions:
  Substrate temperature: 80° C.
  RF power (13.56 MHz): 25 W
  Reaction pressure: 0.2 Torr
  Flow of $SiH_4$: 10 sccm
  Flow of $H_2$: 20 sccm
  Flow of $PH_3$: 0.1 sccm It was observed that, when the above P-doped amorphous silicon film is used for the n-type layer 5, the curve factor of the photovoltaic device is improved from 0.70 to 0.75 because of its high photo electric conductivity ($\sigma$ph) of not less than $10^{-5}$/Ωcm.

Figure 9:
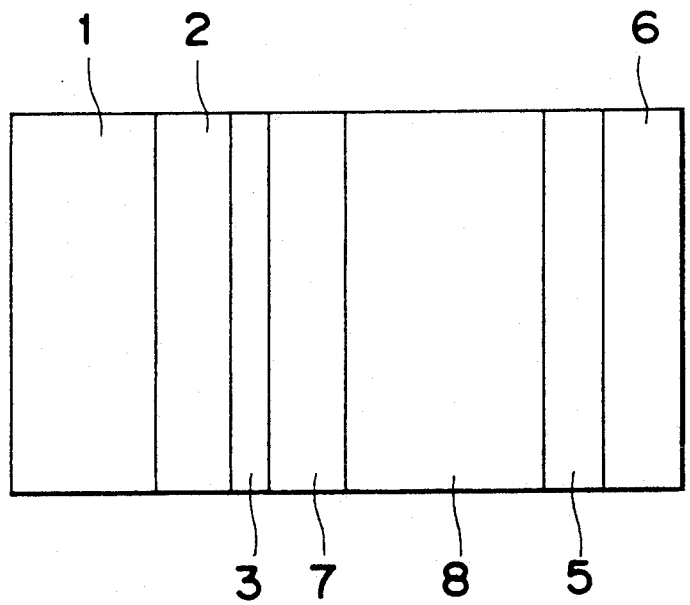
FIGS. 9, 10 and 11 are schematic sectional views showing various photo-semiconductor devices according to the present invention.

FIG. 9 shows a photovoltaic device which is another embodiment of a photo semiconductor device utilizing an amorphous silicon film of the present invention. In this figure, the same parts are denoted by the same reference numerals with those of FIG. 8. The photovoltaic device of FIG. 9 has the same structure as that of the photovoltaic device shown in FIG. 8, except for that two i-type layers, i.e., first i-type layer 7 and second i-type layer 8, are formed between the p-type layer 3 and n-type layer 5 in the photovoltaic device of FIG. 8. The first i-type layer 7 is composed of an amorphous silicon film with a 500 Å, whereas the second i-type layer 8 is composed of an amorphous silicon film with a bandgap of not more than 1.9 eV and a thickness of 5000 Å.

The amorphous silicon layer for the first i-type layer 7 was formed by the PACVD process in accordance with the present invention under the following conditions:
  Substrate temperature: 80° C.
  RF power (13.56 MHz): 25 W (25 mw/cm$^2$)
  Reaction pressure: 0.2 Torr
  Flow of $SiH_4$: 10 sccm
  Flow of $H_2$: 20 sccm The second i-type layer 8 was formed by the PACVD process under the following conditions:
  Substrate temperature: 200° C.
  RF power (13.56 MHz): 25 W
  Reaction pressure: 0.2 Torr
  Flow of $SiH_4$: 10 sccm No hydrogen was supplied to the reaction system.

For the photovoltaic device produced, the measurements were made on photoelectric properties including open-circuit voltage, short-circuit current, and conversion efficiency. Results are as follows:
  Open-circuit voltage: 0.91 v
  Short-circuit current: 17.5 mA/cm$^2$
  Conversion efficiency: 11.2%

The photovoltaic device of this embodiment is much improved in the photoelectric properties as the photovoltaic device of the prior art possesses the open-circuit voltage of 0.85 V, short-circuit current of 17 mA/cm$^2$ and conversion efficiency of 10.4% even at the maximum. The provision of the first i-type layer 7 contributes to improve the adhesion between the p-type layer and the second i-type layer substantially serving as the photo absorption layer, and allows the light to transmit therethrough to the second i-type layer.

Figure 10:
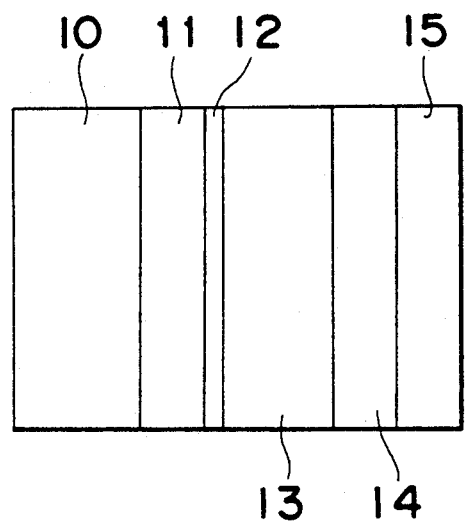

The amorphous silicon film for the first i-type layer 7 may be replaced with an amorphous silicon film having a thickness of 200 Å and being produced under the following conditions:
  Substrate temperature: 50° C.
  RF power (13.56 MHz): 15 W
  Reaction pressure: 0.1 Torr
  Flow of $SiH_4$: 10 sccm FIG. 10 shows a photo sensor which is another example of a photo semiconductor device utilizing an amorphous silicon film of the present invention. The photo sensor comprises a substrate 10 of quartz, a transparent electrode film 11 of $SnO_2$ with a thickness of 1000 Å, an insulating film 12 of amorphous silicon nitride with a thickness of 100 Å, an i-type layer 13 composed of an amorphous silicon film with a thickness of 300 Å, an n-type layer 14 composed of a P-doped amorphous silicon film with a thickness of xxx Å, and a metal electrode film 15 composed of a conductive metal such as Al. These layers or films are deposited in the order illustrated.

The i-type layer 13 is composed of an amorphous silicon film of the present invention, which is formed by the PACVD process under the following conditions:
  Substrate temperature: 30° C.
  RF power (13.56 MHz): 50 W (50 mw/cm$^2$)

Reaction pressure: 0.1 Torr
Flow of SiH$_4$: 10 sccm
Flow of H$_2$: 100 sccm

The photo sensor with the above construction is reduced in the photo absorption coefficient by about 70%, as compared with that of the photovoltaic device of the prior art, i.e, $1 \times 10^4$ cm$^{-1}$ at 650 nm, since the amorphous silicon film of the present invention has a wide bandgap. The amorphous silicon film of the present invention allow light with a wavelength of 500 nm to transmit not less than 95%, thus making it possible to produce photo cell responsible to the light of not less than 500 nm, without use of any specific optical filters.

Figure 11:
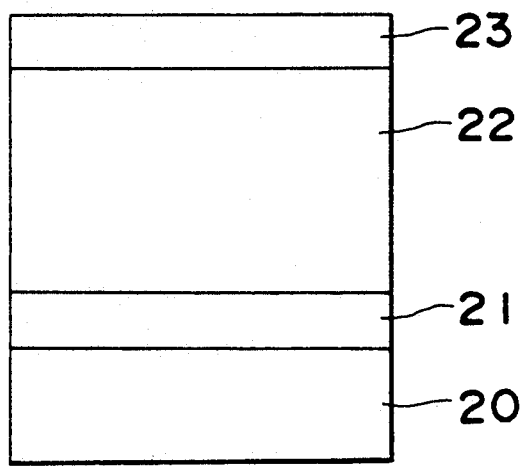

FIG. 11 shows a cross section of a photosensitive drum used for electrophotography, which is another example of a photo semiconductor device utilizing an amorphous silicon film of the present invention. The photosensitive drum comprises a cylindrical substrate 20 of aluminum, a barrier layer 21 deposited on the substrate 20 and composed of an amorphous silicon film with a thickness of 2 μm, a photoconductive layer 22 deposited on the barrier layer 21 and composed of an amorphous silicon layer with a thickness of 25 μm, and a surface layer 23 deposited on the photoconductive layer 22 and composed of an amorphous silicon carbide film with a thickness of 1 μm.

In this embodiment, the photoconductive layer 22 is formed by the PACVD process of the present invention. However, other layers may be deposited by any known thin film deposition techniques such as chemical vapor deposition, vacuum evaporation, sputtering, etc.

The photoconductive layer 22 is prepared by depositing an amorphous silicon film of the present invention on the barrier layer 21, i.e., by the PACVD process of the present invention under the following conditions:

Substrate temperature: 100° C.
RF power (13.56 MHz): 100 W (35 mw/cm$^2$)
Reaction pressure: 0.2 Torr
Flow of SiH$_4$: 50 sccm
Flow of H$_2$: 50 sccm The photoconductive layer prepared under such conditions showed that the resistivity is $10^{11}$ Ωcm in the dark but is reduced to $10^5$ Ωcm when exposed to light. Thus, the ratio of the dark resistivity to the resistivity under exposure to light is $10^6$, which is greater than that of the photoconductive layer of the prior art since the resistivity of the latter is $10^{11}$ Ωcm in the dark but $10^6$ Ωcm under exposure to light. Thus, the photoconductive layer of the amorphous silicon film of the present invention makes it possible to improve the image contrast.

What is claimed is:

1. A method for producing amorphous silicon films containing not less than 30 at. % hydrogen and including silicon atoms joined with one hydrogen atom and silicon atoms joined with two hydrogen atoms, the ratio of said silicon atoms joined with two hydrogen atoms to said silicon atoms joined with one hydrogen atom being not more than 0.4, said method comprising the steps of:

evacuating a reaction vessel to a vacuum of $1 \times 10^{-5}$ Torr or above after positioning a substrate between a pair of electrodes in the reaction vessel;

introducing hydrogen and silane into the reaction vessel to adjust a pressure in the vessel to 0.2 Torr or less, with a ratio of flow, by volume, of hydrogen to silane being not less than 1; and performing plasma-assisted chemical vapor deposition on the substrate at a substrate temperature of not more than 100° C., while supplying hydrogen and silane in said ratio and keeping the pressure in the vessel constant.

2. The method according to claim 1, wherein said plasma-assisted chemical vapor deposition is carried out by applying a ratio frequency power distribution of not more than 17 mW/cm$^2$ between said electrodes.

3. The method according to claim 1, wherein said plasma-assisted chemical vapor deposition is carried out at a pressure of not more than 0.1 Torr.

* * * * *